(12) United States Patent
Sawada et al.

(10) Patent No.: US 8,835,523 B2
(45) Date of Patent: Sep. 16, 2014

(54) SILICONE RUBBER COMPOSITION CURABLE BY RADIAL RAY

(71) Applicant: Shin-Etsu Chemical Co., Ltd., Tokyo (JP)

(72) Inventors: Junichi Sawada, Annaka (JP); Toshiyuki Sutou, Annaka (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/650,898

(22) Filed: Oct. 12, 2012

(65) Prior Publication Data

US 2013/0109776 A1    May 2, 2013

(30) Foreign Application Priority Data

Oct. 28, 2011   (JP) .................................. 2011-238003

(51) Int. Cl.
| | |
|---|---|
| *C03C 25/10* | (2006.01) |
| *C08F 2/46* | (2006.01) |
| *C08G 61/04* | (2006.01) |
| *G03F 7/075* | (2006.01) |
| *G03F 7/027* | (2006.01) |
| *G03F 7/105* | (2006.01) |

(52) U.S. Cl.
CPC .............. *G03F 7/105* (2013.01); *G03F 7/0757* (2013.01); *G03F 7/027* (2013.01)
USPC .................................... 522/172; 522/1; 520/1

(58) Field of Classification Search
CPC .............. C08F 30/08; C08F 2/50; C08F 2/48; C08L 83/04; C08L 83/08; C09D 4/00
USPC .......................................... 522/172, 1; 520/1
See application file for complete search history.

(56) References Cited

U.S. PATENT DOCUMENTS

| | | | |
|---|---|---|---|
| 4,733,942 A | 3/1988 | Hida et al. | |
| 6,069,186 A | 5/2000 | Okinoshima et al. | |
| 7,816,419 B2 * | 10/2010 | Tsuchida et al. | 522/99 |
| 8,299,185 B2 * | 10/2012 | Saito et al. | 525/477 |
| 2003/0064232 A1 * | 4/2003 | Allen et al. | 428/447 |

FOREIGN PATENT DOCUMENTS

| | | |
|---|---|---|
| JP | B2-4-25231 | 4/1992 |
| JP | A-11-302348 | 11/1999 |

OTHER PUBLICATIONS

Yang, Hyun-Kwan, A. Evren Ozcam, Kirill Efimenko, and Jan Genzer, Photochromic materials with tunable color and mechanical flexibility, Apr. 21, 2011, Soft Matter, vol. 7, No. 8, 3652-4072.*

* cited by examiner

*Primary Examiner* — Ling Choi
*Assistant Examiner* — Jessica E Whiteley
(74) *Attorney, Agent, or Firm* — Oliff PLC

(57) ABSTRACT

There is disclosed a silicone rubber composition curable by a radial ray comprising, at least, (A) an organopolysiloxane shown by the following general formula (1), (B) a phenyl ester derivative having an acryl group, (C) a sensitizer sensitized by a radial ray, and (D) a photosensitive dye,

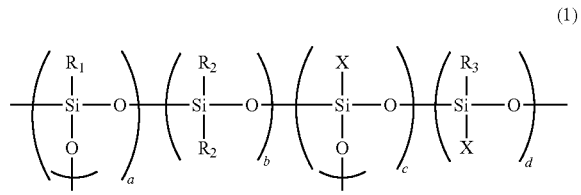

(1)

wherein each $R_1$, $R_2$, and $R_3$ independently represents a monovalent hydrocarbon group having 1 to 10 carbon atoms; X represents the same or different monovalent organic group having an acryl group or a methacryl group. As a result, there is provided a silicone rubber composition capable of being cured by irradiation of a radial ray whereby showing excellent adhesion with various substrates, capable of forming a cured film, and capable of easily distinguishing whether it is cured or not by observing appearance when not irradiated with a radial ray.

17 Claims, No Drawings

SILICONE RUBBER COMPOSITION CURABLE BY RADIAL RAY

BACKGROUND OF THE INVENTION

1. Field of the Invention

The present invention relates to a silicone rubber composition curable by a radial ray, especially useful as a sealant of an electric and electronic part.

2. Description of the Related Art

An organopolysiloxane composition curable by irradiation of a radial ray such as an UV beam has been already known. For example, an organopolysiloxane composition comprising an organopolysiloxane having a vinyl functional group and a photo-polymerization initiator is excellent as a coating material for an optical fiber curable by a radial ray (Patent Document 1). However, this composition is left as an uncured liquid if not irradiated with an UV beam so that there has been an instance that this flows into a device having this coated part thereby causing pollution.

This drawback could be remedied by an organopolysiloxane composition (Patent Document 2) comprising at least a certain organopolysiloxane having radial-ray reactive (meth)acryloyl groups in its both chain terminals, a photosensitizer, and a tetraalkyl silane or its partially-hydrolyzed condensate; but this could not fully satisfy the recent requirement of high curing rate nor the requirement of lower light intensity of a radial ray during curing. In addition, a problem of uncured state occurred during the trouble of an UV-beam irradiating equipment.

CITATION LIST

Patent Literature

Patent Document 1: Japanese Patent Examined Application No. H04-25231

Patent Document 2: Japanese Patent Laid-Open Publication No. H11-302348

SUMMARY OF THE INVENTION

The present invention was made to solve the problems mentioned above and has an object to provide a silicone rubber composition capable of being cured by a small light intensity of a radial ray with a short time irradiation whereby showing excellent and rapid adhesion with various substrates, capable of forming a cured film having an excellent anticorrosive effect of a substrate even under a severe condition, and capable of easily distinguishing whether it is cured or not by observing appearance when not irradiated with a radial ray such as a UV beam, a far UV beam, an electron beam, an X-ray, and a γ-ray. In addition, another object of the present invention is to provide an electric or an electronic device sealed by a cured resin product of this silicone rubber composition curable by a radial ray thereby having excellent reliability.

To solve the problems mentioned above, the present invention provides a silicone rubber composition curable by a radial ray comprising, at least, (A) an organopolysiloxane shown by the following general formula (1), (B) a phenyl ester derivative having an acryl group, (C) a sensitizer sensitized by a radial ray, and (D) a photosensitive dye,

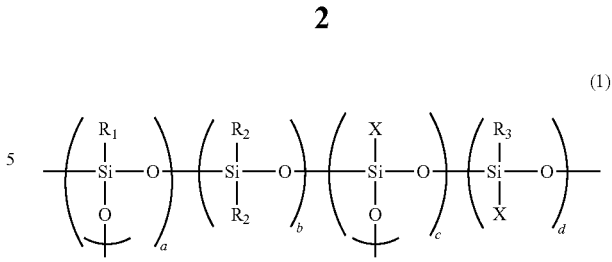

(1)

wherein each $R_1$, $R_2$, and $R_3$ independently represents a monovalent hydrocarbon group having 1 to 10 carbon atoms; X represents the same or different monovalent organic group having an acryl group or a methacryl group; and a, b, c, and d represent respective numbers satisfying the relationships of $0.1 \leq a < 1.0$, $0.1 \leq b < 1.0$, $0 \leq c \leq 0.8$, $0 \leq d \leq 0.8$, $c+d > 0$, and $a+b+c+d=1$.

According to the composition as mentioned above, a silicone rubber composition capable of being cured by a small light intensity of a radial ray with a short time irradiation whereby showing excellent and rapid adhesion with various substrates, capable of forming a cured film having an excellent anticorrosive effect of a substrate even under a severe condition, and capable of easily distinguishing whether it is cured or not by observing appearance when not irradiated with a radial ray such as a UV beam, a far UV beam, an electron beam, an X-ray, and a γ-ray can be obtained.

Here, it is preferable that at least one of $R_1$, $R_2$, and $R_3$ be a monovalent aromatic hydrocarbon group having 6 to 10 carbon atoms. In addition, it is preferable that the composition contain 0.1 to 1000 parts by mass of the component (B) and 0.1 to 100 parts by mass of the component (C) relative to 100 parts by mass of the component (A), and 0.001 to 1 parts by mass of the component (D) relative to 100 parts by mass of totality of the components (A) to (C).

According to the silicone rubber composition curable by a radial ray as mentioned above, a silicone rubber composition capable of being cured by a further small light intensity of a radial ray with a short time irradiation whereby showing further excellent and rapid adhesion with various substrates, capable of forming a cured film having a further excellent anticorrosive effect of a substrate even under a severe condition, and capable of further easily distinguishing whether it is cured or not by observing appearance when not irradiated with a radial ray such as a UV beam, a far UV beam, an electron beam, an X-ray, and a γ-ray can be obtained.

In addition, it is preferable that moisture vapor transmission rate of a cured resin product of the silicone rubber composition curable by a radial ray, as measured according to JIS Z 0208, be 20 g/mm$^2$·day or less.

According to the silicone rubber composition curable by a radial ray which can give a cured resin product having moisture vapor transmission rate as mentioned above, a cured film having a further excellent anticorrosive effect of a substrate even under a severe condition can be formed.

Further, the present invention provides a device sealed with a cured resin product of the silicone rubber composition curable by a radial ray.

According to the device, especially an electronic device and an electric device, as mentioned above, a highly reliable device covered with a cured film having a further excellent anticorrosive effect of a substrate even under a severe condition can be obtained.

As explained above, according to the silicone rubber composition curable by a radial ray of the present invention, a silicone rubber composition capable of being cured by a small light intensity of a radial beam with a short time irradiation whereby showing excellent and rapid adhesion with various substrates, capable of forming a cured film having an excellent anticorrosive effect of a substrate even under a severe condition, and capable of easily distinguishing whether it is cured or not by observing appearance when not irradiated with a radial ray such as a UV beam, a far UV beam, an electron beam, an X-ray, and a γ-ray can be obtained. Especially, the silicone rubber composition as mentioned above can be readily cured by a small irradiation energy dose; and thus, it is especially useful as a protective coating material of a liquid crystal electrode, an organic EL electrode, and a plasma display electrode, which are prone to be easily affected by a radial ray such as an UV beam.

In addition, according to the devices, especially an electronic device and an electric device, which are sealed by a cured resin product of the silicone rubber composition curable by a radial ray of the present invention, a highly reliable device covered with a cured film having a further excellent anticorrosive effect of a substrate even under a severe condition can be obtained.

DETAILED DESCRIPTION OF THE PREFERRED EMBODIMENTS

Hereinafter, the present invention will be explained in more detail, but the present invention is not limited to them. Meanwhile, terms of (meth)acryloyl, (meth)acryl, and (meth)acrylate are used to express any one of an acryloyl and a methacryloyl or both, any one of an acryl and a methacryl or both, and any one of an acrylate and a methacrylate or both, respectively. In addition, "Me" means a methyl group.

Inventors of the present invention carried out an extensive investigation, and as a result, they found that, according to the silicone rubber composition curable by a radial ray comprising, at least, (A) an organopolysiloxane shown by the following general formula (1), (B) a phenyl ester derivative having an acryl group, (C) a sensitizer sensitized by a radial ray, and (D) a photosensitive dye, a silicone rubber composition capable of being cured by a small light intensity of a radial beam with a short time irradiation whereby showing excellent and rapid adhesion with various substrates, capable of forming a cured film having an excellent anticorrosive effect of a substrate even under a severe condition, and capable of easily distinguishing whether it is cured or not by observing appearance when not irradiated with a radial ray such as a UV beam, a far UV beam, an electron beam, an X-ray, and a γ-ray could be obtained, whereby accomplished the present invention.

Hereinafter, each component of the present invention will be explained in more detail.

[(A) Organopolysiloxane]

The organopolysiloxane of the component (A) of the present invention is shown by the following general formula (1) and is a main component of the silicone rubber composition curable by a radial ray of the present invention,

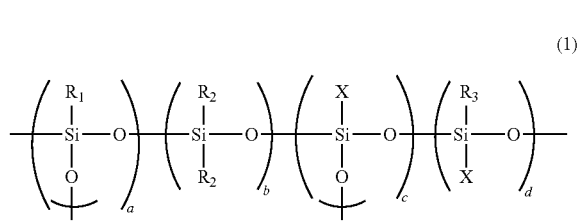

(1)

wherein each $R_1$, $R_2$, and $R_3$ independently represents a monovalent hydrocarbon group having 1 to 10 carbon atoms; X represents the same or different monovalent organic group having an acryl group or a methacryl group; and a, b, c, and d represent respective numbers satisfying the relationships of $0.1 \leq a < 1.0$, $0.1 \leq b < 1.0$, $0 \leq c \leq 0.8$, $0 \leq d \leq 0.8$, $c+d>0$, and $a+b+c+d=1$.

In the general formula (1), each $R_1$, $R_2$, and $R_3$ independently represents a monovalent hydrocarbon group having 1 to 10 carbon atoms. It is preferable that at least one of $R_1$, $R_2$, and $R_3$ be a monovalent aromatic hydrocarbon group having 6 to 10 carbon atoms.

Specific example of the monovalent hydrocarbon group having 1 to 10 carbon atoms includes an alkyl group such as a methyl group, an ethyl group, a propyl group, an isopropyl group, a butyl group, an isobutyl group, a tert-butyl group, a pentyl group, a hexyl group, a heptyl group, a 2-ethylhexyl group, an octyl group, and a nonyl group; a cycloalkyl group such as a cyclohexyl group and a cycloheptyl group; an alkenyl group such as a vinyl group, an allyl group, a propenyl group, an isopropenyl group, a butenyl group, and a hexenyl group; and the foregoing groups having at least a part of their hydrogen atoms which are bonded to the carbon atom thereof and substituted with a halogen atom, a cyano group, and so forth, including a chloromethyl group, a cyanoethyl group, and a 3,3,3-trifluoropropyl group.

Specific example of the monovalent aromatic hydrocarbon group having 6 to 10 carbon atoms includes an aryl group such as a phenyl group and a tolyl group; an aralkyl group such as a benzyl group, a phenylethyl group, and a 3-phenylpropyl group; and the foregoing groups having at least a part of their hydrogen atoms which are bonded to the carbon atom thereof and substituted with a halogen atom, a cyano group, and so forth.

In the organopolysiloxane of the component (A) of the present invention, it is especially preferable that 30% by mole or more, or more preferably 50% by mole or more of $R_1$, $R_2$, and $R_3$ in one molecule of the organopolysiloxane be a phenyl group.

In the general formula (1), X represents the same or different monovalent organic group having an acryl group or a methacryl group. Illustrative example of X includes a monovalent organic group having a (meth)acryloyl group, namely any one of $CH_2$=CHCO— and $CH_2$=C($CH_3$)CO— or both, as the (meth)acryloyloxy group. Specific example of the monovalent organic group having this (meth)acryloyl group includes an alkyl group having 1 to 10 carbon atoms, or preferably 2 to 6 carbon atoms, which is substituted with 1 to 3 (meth)acryloyloxy groups, as shown below.

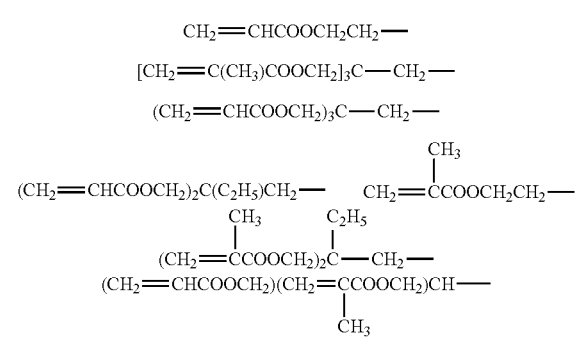

In the present invention, among those mentioned above, the groups shown below are preferable, and

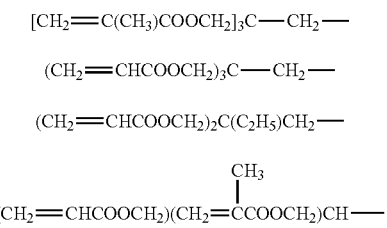

the groups shown below are more preferable.

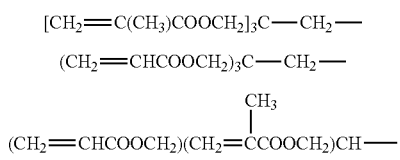

In the general formula (1), a, b, c, and d represent respective numbers satisfying the relationships of $0.1 \leq a < 1.0$, $0.1 \leq b < 1.0$, $0 \leq c \leq 0.8$, $0 \leq d \leq 0.8$, $c+d > 0$, and $a+b+c+d=1$.

Specific preferable example of the organopolysiloxane shown by the general formula (1) includes those shown by the following general formula (2),

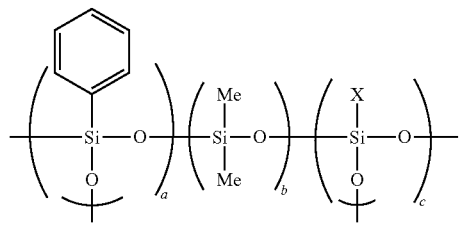

(2)

wherein a, b, and c represent respective numbers satisfying the relationships of $0.1 \leq a < 1.0$, $0.1 \leq b < 1.0$, $0 < c \leq 0.8$, and $a+b+c=1$; and X represents the following,

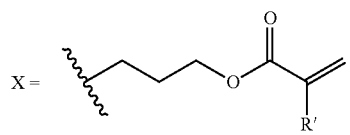

wherein R' represents a hydrogen atom or a methyl group.

This organopolysiloxane of the component (A) has X which contains a (meth)acryl group as the group capable of being polymerized by a radial ray; and thus, this can be readily polymerized by irradiation of a radial ray such as a UV beam, a far UV beam, an electron beam, an X-ray, and a γ-ray whereby curing the silicone rubber composition curable by a radial ray of the present invention. Meanwhile, the organopolysiloxane of the component (A) may be used singly or in a combination of two or more of them.

The organopolysiloxane of the component (A) can be prepared, for example, by a hydrolysis reaction of corresponding alkoxysilanes as shown below,

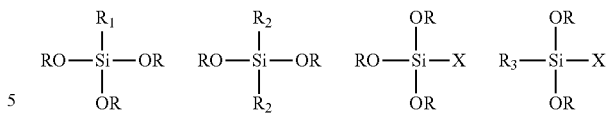

wherein $R_1$, $R_2$, and $R_3$ represent the same meanings as before; and OR represents a hydrolysable group, wherein, for example, R represents a methyl group.

Illustrative example of the foregoing alkoxysilanes include those shown by the following formulae.

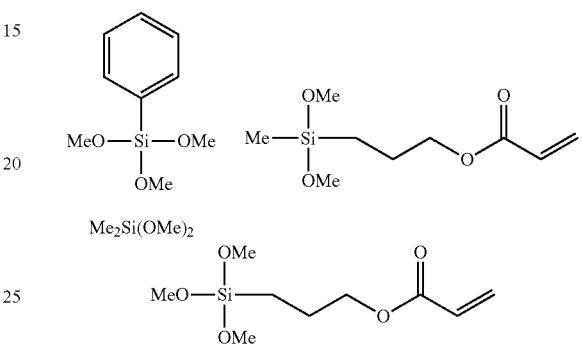

[(B) Phenyl Ester Derivative Having an Acryl Group]

The phenyl ester derivative having an acryl group which is the component (B) of the present invention is not particularly restricted, and 2-hydroxy-3-phenoxypropyl acrylate, phenoxyethyl acrylate, phenoxydiethyleneglycol acrylate, and so forth may be used.

In the present invention, compounds of the component (B) may be used singly or in a combination of two or more of them. Amount of the component (B) to be used is preferably 0.1 to 10000 parts by mass, more preferably 0.1 to 1000 parts by mass, or most preferably 10 to 1000 parts by mass, relative to 100 parts by mass of the component (A).

[(C) Sensitizer Sensitized by a Radial Ray]

The sensitizer sensitized by a radial ray of the component (C) in the present invention is not particularly restricted; but it is preferable to use a benzoyl compound (or a phenyl ketone compound) such as benzophenone, in particular, a benzoyl compound (or a phenyl ketone compound) which has a hydroxyl group on the α-position of the carbonyl group thereof, such as 1-hydroxycyclohexyl phenyl ketone, 2-hydroxy-2-methyl-1-phenylpropane-1-one, and 1-(4-isopropylphenyl)-2-hydroxy-2-methylpropane-1-one.

Illustrative example of other sensitizer sensitized by a radial ray of the component (C) in the present invention includes an organophosphine oxide compound such as 2,4,6-trimethylbenzoyl diphenylphosphine oxide, bisacyl monoorganophosphine oxide, and bis(2,6-dimethoxybenzoyl)-2,4,4-trimethyl pentylphsophine oxide; a benzoin ether compound such as isobutyl benzoin ether; a ketal compound such as acetophenone diethyl ketal; a thioxanthone compound; and an acetophenone compound.

In the present invention, the sensitizer sensitized by a radial ray of the component (C) may be used singly or in a combination of two or more of them.

Amount of the component (C) to be used in the present invention is not particularly restricted provided that the amount thereof is effective to cure the composition of the present invention; but the amount thereof is preferably 0.1 to 100 parts by mass, more preferably 0.1 to 10 parts by mass, still more preferably 0.5 to 10 parts by mass, or most preferably 1.0 to 5.0 parts by mass, relative to 100 parts by mass of the component (A).

[(D) Photo-Sensitive Dye]

The photo-sensitive dye of the component (D) of the present invention is the one which has different color tone before and after irradiation of a radial ray such as a UV beam, a far UV beam, an electron beam, an X-ray, and a γ-ray; and it can be used singly or in a combination of two or more of them.

By adding the component (D), it becomes possible to easily confirm whether the composition is cured or not by visually observing the change of color tone even if a radial ray is not irradiated because of some reason not to cure the composition thereof.

Specific example thereof includes 1',3'-dihydro-1',3',3'-trimethyl-6-nitrospiro[2H-1-benzopyrane-2,2'-[2H]indole (following formula [A]), 1,3,3-trimethylindolino-spironaphthoxazine (following formula [B]), and 1,3,3-trimethylspiro[2H-indole-2,3'-[3H]pyrido[4,3-f][1,4]benzoxazine, wherein amount thereof to be added is preferably 0.001 to 1 part by mass relative to 100 parts by mass of the totality of the components (A) to (C).

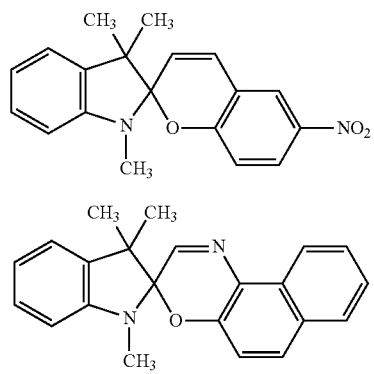

[Other Components]

In addition to the components (A) to (D), other components may be added optionally into the composition of the present invention to the degree that object and effect of the present invention are not inversely affected. Various additives may be added thereto to appropriately control, such as for example, contraction rate by curing, thermal expansion coefficient of its cured product, mechanical strength, heat resistance, chemical resistance, flame retardant properties, and gas permeation rate.

In the present invention, other components such as for example, an inorganic filler material such as fumed silica, silica aerogel, powdered quarts, glass fibers, iron oxide, titanium oxide, calcium carbonate, and magnesium carbonate, and a radical polymerization inhibitor (pot-life extending material) such as hydroquinone, methoxyhydroquinone, and 2,6-di-tert-butyl-p-cresol may be added thereinto.

The silicone rubber composition curable by a radial ray of the present invention can be obtained by mixing the components (A) to (D), and optionally other additives as mentioned above. By irradiating a radial ray to the composition thus obtained, the composition can be cured promptly whereby expressing strong adhesion immediately after curing.

It is preferable that moisture vapor transmission rate of the thus cured resin product of the silicone rubber composition curable by a radial ray, as measured according to JIS Z 0208, be 20 g/mm²·day or less. A silicone rubber composition curable by a radial ray to give a cured resin product having moisture vapor transmission rate as mentioned above can form a cured film having a further excellent anticorrosive effect of a substrate even under a severe condition.

In the present invention, a radial ray such as a UV beam, a far UV beam, an electron beam, an X-ray, and a γ-ray may be used; but in view of easiness of the equipment, easy handling thereof, and so on, an UV beam is preferably used. Illustrative example of the UV light source includes a UV LED lamp, a high-pressure mercury lamp, an ultra-high pressure mercury lamp, a metal halide lamp, a carbon arc lamp, and a xenon lamp. Irradiance level of the UV beam (peak wavelength: 320 to 390 nm) is 100 to 2400 mJ/cm², or preferably 200 to 800 mJ/cm², relative to the sheet formed with the thickness of 2 mm by using the composition of the present invention.

A cured resin product obtained by curing the silicone rubber composition curable by a radial ray can seal a device, especially an electronic device and an electric device. The devices thus obtained are highly reliable.

A cured product obtained from the composition of the present invention is useful, for example, not only as an top coat of an electrode of a flat panel display, a plasma display, and so forth but also as a top coat or as a sealant of various electric and electronic parts, and has an extremely excellent anticorrosive effect even under a severe condition.

EXAMPLES

Hereinafter, the present invention will be explained in more detail by Synthesis Examples, Examples, and Comparative Example; but the present invention is not limited to these Examples. Meanwhile, "%" shown hereafter means "% by mass".

Synthesis Example 1

Into a 2-L flask equipped with a cock were added 295 g (1.5 mole) of phenyl trimethoxy silane, 60.1 g (0.5 mole) of dimethyl dimethoxy silane, 23.4 g (0.1 mole) of 3-acryloxypropyl trimethoxy silane, 270 g of toluene, and 156 g of IPA; and after the resulting mixture was stirred at room temperature, 156 g of water and 17.2 g of an aqueous 25% solution of tetramethyl ammonium hydroxide were added thereinto. After this mixture was stirred at room temperature for 3 hours, 200 g of an aqueous 10% solution of sodium dihydrogenphosphate was added thereinto for neutralization. The resulting organic layer was separated, washed with water, and then concentrated under reduced pressure to obtain a product shown by the following formula.

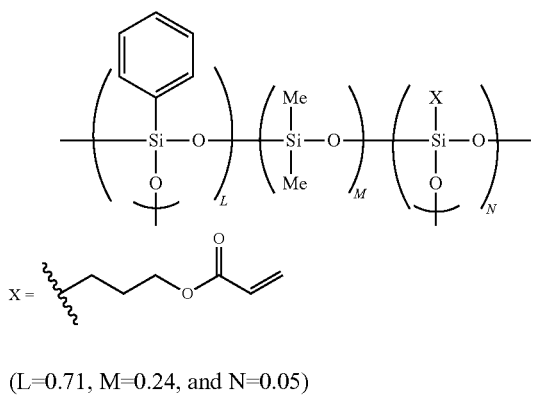

(L=0.71, M=0.24, and N=0.05)

Synthesis Example 2

Into a 5-L flask equipped with a cock were added 237.9 g (1.2 mole) of phenyl trimethoxy silane, 244.36 g (1.5 mole) of diphenyl dimethoxy silane, 174.6 g (0.8 mole) of 3-acryloxypropyl methyl dimethoxy silane, 23.4 g (0.1 mole) of 3-acryloxypropyl trimethoxy silane, 800 g of toluene, and 400 g of IPA; and after the resulting mixture was stirred at room temperature, 400 g of water and 37.8 g of an aqueous 25% solution of tetramethyl ammonium hydroxide were added thereinto. After this mixture was stirred at room temperature for 3 hours, 500 g of an aqueous 10% solution of sodium dihydrogenphosphate was added thereinto for neutralization. The resulting organic layer was separated, washed with water, and then concentrated under reduced pressure to obtain a product shown by the following formula.

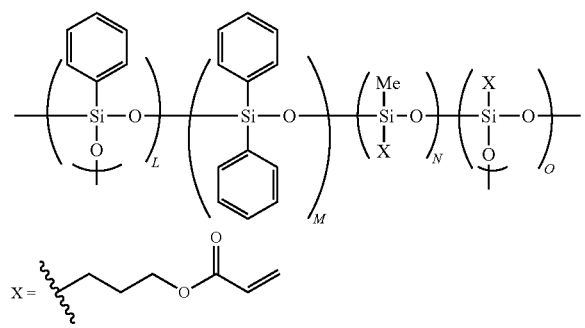

($L=0.3$, $M=0.4$, $N=0.2$, and $O=0.1$)

Example 1

Components (A) to (D) shown below were mixed to obtain the organopolysiloxane composition 1 curable by a radial ray of the present invention was obtained.
(A) Reaction product obtained by Synthesis Example 1: 50 parts by mass
(B) 2-Hydroxy-3-phenoxypropyl acrylate (KAYARAD R-128, manufactured by Nippon Kayaku Co., Ltd.): 50 parts by mass
(C) Sensitizer sensitized by a radial ray (IRGACURE 907, manufactured by BASF SE): 2.5 parts by mass
(D) Photo-sensitive dye (5% acetone solution of 1',3'-dihydro-1',3',3'-trimethyl-6-nitrospiro[2H-1-benzopyran-2,2'-[2H]-indol]): 0.2 parts by mass Composition 1 thus obtained was charged into a mold with the depth of 1 mm, width of 120 mm, and length of 170 mm, and then exposed to a UV beam for 2 seconds (energy dose of 200 mJ) in a conveyer furnace equipped with two metal halide mercury lamps (illumination intensity of 40 W/cm$^2$) to obtain cured product 1.

Example 2

Components (A) to (D) shown below were mixed to obtain the organopolysiloxane composition 2 curable by a radial ray of the present invention was obtained.
(A) Reaction product obtained by Synthesis Example 2: 99 parts by mass
(B) 2-Hydroxy-3-phenoxypropyl acrylate (KAYARAD R-128, manufactured by Nippon Kayaku Co., Ltd.): 1 part by mass
(C) Sensitizer sensitized by a radial ray (IRGACURE 907, manufactured by BASF SE): 2.5 parts by mass
(D) Photo-sensitive dye (5% acetone solution of 1',3'-dihydro-1',3',3'-trimethyl-6-nitrospiro[2H-1-benzopyran-2,2'-[2H]-indol]): 0.5 parts by mass Composition 2 thus obtained was charged into a mold with the depth of 1 mm, width of 120 mm, and length of 170 mm, and then exposed to a UV beam for 2 seconds (energy dose of 200 mJ) in a conveyer furnace equipped with two metal halide mercury lamps (illumination intensity of 40 W/cm$^2$) to obtain cured product 2.

Example 3

Components (A) to (D) shown below were mixed to obtain the organopolysiloxane composition 3 curable by a radial ray of the present invention was obtained.
(A) Reaction product obtained by Synthesis Example 1: 10 parts by mass
(B) 2-Hydroxy-3-phenoxypropyl acrylate (KAYARAD R-128, manufactured by Nippon Kayaku Co., Ltd.): 90 parts by mass
(C) Sensitizer sensitized by a radial ray (IRGACURE 907, manufactured by BASF SE): 2.5 parts by mass
(D) Photo-sensitive dye (5% acetone solution of 1',3'-dihydro-1',3',3'-trimethyl-6-nitrospiro[2H-1-benzopyran-2,2'-[2H]-indol]): 1.0 part by mass Composition 3 thus obtained was charged into a mold with the depth of 1 mm, width of 120 mm, and length of 170 mm, and then exposed to a UV beam for 2 seconds (energy dose of 200 mJ) in a conveyer furnace equipped with two metal halide mercury lamps (illumination intensity of 40 W/cm$^2$) to obtain cured product 3.

Example 4

Components (A) to (D) shown below were mixed to obtain the organopolysiloxane composition 4 curable by a radial ray of the present invention was obtained.
(A) Reaction product obtained by Synthesis Example 1: 50 parts by mass
(B) Phenoxyethyl acrylate (Light Acrylate PO-A, manufactured by Kyoeisha Chemical Co., Ltd.): 50 parts by mass
(C) Sensitizers sensitized by a radial ray (IRGACURE 907, manufactured by BASF SE): 2.0 parts by mass, and (KAYACURE BMS, manufactured by Nippon Kayaku Co., Ltd.): 0.5 parts by mass
(D) Photo-sensitive dye (5% acetone solution of 1,3,3-trimethylindolino-spironaphthoxazine): 0.4 parts by mass Composition 4 thus obtained was charged into a mold with the depth of 1 mm, width of 120 mm, and length of 170 mm, and then exposed to a UV beam for 2 seconds (energy dose of 200 mJ) in a conveyer furnace equipped with two metal halide mercury lamps (illumination intensity of 40 W/cm$^2$) to obtain cured product 4.

Example 5

Components (A) to (D) shown below were mixed to obtain the organopolysiloxane composition 5 curable by a radial ray of the present invention was obtained.
(A) Reaction product obtained by Synthesis Example 2: 75 parts by mass
(B) Phenoxyethyl acrylate (Light Acrylate PO-A, manufactured by Kyoeisha Chemical Co., Ltd.): 25 parts by mass (C) Sensitizers sensitized by a radial ray (IRGACURE 907, manufactured by BASF SE): 2.0 parts by mass, and (KAYACURE BMS, manufactured by Nippon Kayaku Co., Ltd.): 0.5 parts by mass
(D) Photo-sensitive dye (5% acetone solution of 1,3,3-trimethylindolino-spironaphthoxazine): 1.0 part by mass Composition 5 thus obtained was charged into a mold with the depth of 1 mm, width of 120 mm, and length of 170 mm, and then exposed to a UV beam for 2 seconds (energy dose of 200 mJ) in a conveyer furnace equipped with two metal halide mercury lamps (illumination intensity of 40 W/cm$^2$) to obtain cured product 5.

<Evaluation of Various Performances>

With regard to each of the cured products 1 to 5, hardness thereof was measured with a spring A type measurement instrument in accordance with JIS K 6301. Moisture vapor transmission rate thereof was measured in accordance with JIS Z 0208. These results are shown in Table 1.

Comparative Example 1

Composition 6 was prepared similarly to Example 1 except that the organopolysiloxane of the component (A) used in Example 1 was changed to urethane acrylate (UX-4101, manufactured by Nippon Kayaku Co., Ltd.); and cured product 6 was prepared similarly to Example 1, and then, the tests thereof were carried out. These results are shown in Table 1.

TABLE 1

| | | | Example 1 | Example 2 | Example 3 | Example 4 | Example 5 | Comparative Example 1 |
|---|---|---|---|---|---|---|---|---|
| Physical properties | Hardness | Type A | 90 | 78 | 94 | 88 | 81 | 79 |
| | Moisture vapor transmission rate | g/mm$^2$ · day | 9 | 18 | 10 | 11 | 17 | 30 |
| | Surface tackiness | | No | No | No | No | No | Yes |
| | Appearance before UV irradiation | Visual | Transparent | Transparent | Transparent | Transparent | Transparent | Transparent |
| | Appearance after UV irradiation | Visual | Pale-yellow | Pale-yellow | Pale-yellow | Pale-red | Pale-red | Transparent |

From the results shown in Table 1, it can be confirmed that not only the organopolysiloxane composition curable by a radial ray of the present invention can be cured adequately with a small irradiation energy dose but also moisture vapor transmission rate of the cured product thereof is adequately low. In addition, the composition of the present invention changes its appearance (color tone) clearly before and after curing; and thus, curing of the composition can be confirmed easily.

The silicone rubber composition curable by a radial ray of the present invention can be readily cured by a small irradiation energy dose; and thus, this composition is shown to be extremely useful industrially not only as a protective coating material of a liquid crystal electrode, an organic EL electrode, and a plasma display electrode, which are prone to be easily affected by a radial ray such as an UV beam but also as a protective coating material of various electric and electronic parts.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A silicone rubber composition curable by a radial ray comprising, at least,
    (A) an organopolysiloxane shown by the following general formula (I),
    (B) a phenyl ester derivative having only one acryl group,
    (C) a sensitizer sensitized by a radial ray, and
    (D) a photosensitive dye having a configuration such that a color tone of the photosensitive dye before irradiation by the radial ray is different than a color tone of the photosensitive dye after irradiation by the radial ray, the color tone of the photosensitive dye after irradiation being irreversible,
    wherein the radial ray is at an irradiance level of 200 to 800 mJ/cm$^2$, and/or for an irradiance time of 2 seconds or less, and

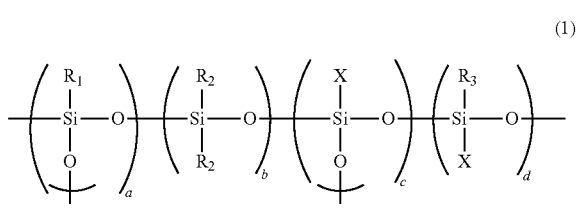

wherein:
    each $R_1$, $R_2$, and $R_3$ independently represents a monovalent hydrocarbon group having 1 to 10 carbon atoms;
    X represents the same or different monovalent organic group having an acryl group or a methacryl group; and
    a, b, c, and d represent respective numbers satisfying the relationships of $0.1 \leq a < 1.0$, $0.1 \leq b < 1.0$, $0 \leq c \leq 0.8$, $c+d>0$, and $a+b+c+d=1$.

2. The silicone rubber composition curable by a radial ray according to claim 1, wherein at least one of the foregoing $R_1$, $R_2$, and $R_3$ is a monovalent aromatic hydrocarbon group having 6 to 10 carbon atoms.

3. The silicone rubber composition curable by a radial ray according to claim 1, wherein the composition contains 0.1 to 1000 parts by mass of the component (B) and 0.1 to 100 parts by mass of the component (C) relative to 100 parts by mass of the component (A), and 0.001 to 1 parts by mass of the component (D) relative to 100 parts by mass of totality of the components (A) to (C).

4. The silicone rubber composition curable by a radial ray according to claim 2, wherein the composition contains 0.1 to 1000 parts by mass of the component (B) and 0.1 to 100 parts by mass of the component (C) relative to 100 parts by mass of the component (A), and 0.001 to 1 parts by mass of the component (D) relative to 100 parts by mass of totality of the components (A) to (C).

5. The silicone rubber composition curable by a radial ray according to claim 1, wherein moisture vapor transmission rate of a cured resin product of the silicone rubber composition curable by a radial ray, as measured according to JIS Z 0208, is 20 g/mm$^2$·day or less.

6. The silicone rubber composition curable by a radial ray according to claim 2, wherein moisture vapor transmission rate of a cured resin product of the silicone rubber composition curable by a radial ray, as measured according to JIS Z 0208, is 20 g/mm$^2$·day or less.

7. The silicone rubber composition curable by a radial ray according to claim 3, wherein moisture vapor transmission rate of a cured resin product of the silicone rubber composition curable by a radial ray, as measured according to JIS Z 0208, is 20 g/mm$^2$·day or less.

8. The silicone rubber composition curable by a radial ray according to claim 4, wherein moisture vapor transmission rate of a cured resin product of the silicone rubber composition curable by a radial ray, as measured according to JIS Z 0208, is 20 g/mm$^2$·day or less.

9. A device sealed with a cured resin product obtained by curing the silicone rubber composition curable by a radial ray according to claim 1.

10. A device sealed with a cured resin product obtained by curing the silicone rubber composition curable by a radial ray according to claim 2.

11. A device sealed with a cured resin product obtained by curing the silicone rubber composition curable by a radial ray according to claim 3.

12. A device sealed with a cured resin product obtained by curing the silicone rubber composition curable by a radial ray according to claim 4.

13. A device sealed with a cured resin product obtained by curing the silicone rubber composition curable by a radial ray according to claim 5.

14. A device sealed with a cured resin product obtained by curing the silicone rubber composition curable by a radial ray according to claim 6.

15. A device sealed with a cured resin product obtained by curing the silicone rubber composition curable by a radial ray according to claim 7.

16. A device sealed with a cured resin product obtained by curing the silicone rubber composition curable by a radial ray according to claim 8.

17. The silicone rubber composition curable by a radial ray according to claim 1, wherein the phenyl ester derivative is at least one of 2-hydroxy-3-phenoxypropyl acrylate, phenoxyethyl acrylate, and phenoxydiethyleneglycol acrylate.

* * * * *